US011434385B2

(12) United States Patent
Lannuzel et al.

(10) Patent No.: US 11,434,385 B2
(45) Date of Patent: Sep. 6, 2022

(54) METHOD FOR PREPARING A CROSS-LINKED FLUORINATED POLYMER FILM

(71) Applicants: ARKEMA FRANCE, Colombes (FR); CENTRE NATIONAL DE LA RECHERCHE SCIENTIFIQUE, Paris (FR); Universite De Montpellier, Montpellier (FR); ECOLE NATIONALE SUPERIEURE DE CHIMIE DE MONTPELLIER, Montpellier (FR)

(72) Inventors: Thierry Lannuzel, Villeurbanne (FR); Fabrice Domingues Dos Santos, Paris (FR); Thibaut Soulestin, Lyons (FR); Vincent Ladmiral, Montpellier (FR); Bruno Ameduri, Montpellier (FR)

(73) Assignee: ARKEMA FRANCE, Colombes (FR)

( * ) Notice: Subject to any disclaimer, the term of this patent is extended or adjusted under 35 U.S.C. 154(b) by 0 days.

(21) Appl. No.: 16/633,297

(22) PCT Filed: Jul. 17, 2018

(86) PCT No.: PCT/FR2018/051818
§ 371 (c)(1),
(2) Date: Jan. 23, 2020

(87) PCT Pub. No.: WO2019/020906
PCT Pub. Date: Jan. 31, 2019

(65) Prior Publication Data
US 2020/0157365 A1 May 21, 2020

(30) Foreign Application Priority Data
Jul. 28, 2017 (FR) ...................................... 1757202

(51) Int. Cl.
C08F 2/46 (2006.01)
C08F 2/50 (2006.01)
C08G 61/04 (2006.01)
C09D 11/106 (2014.01)
C08F 214/24 (2006.01)
C08K 5/00 (2006.01)
(Continued)

(52) U.S. Cl.
CPC .......... C09D 11/106 (2013.01); C08F 214/24 (2013.01); C08K 5/0025 (2013.01); C08K 5/06 (2013.01); C08K 5/07 (2013.01); C08K 5/10 (2013.01); C08K 5/17 (2013.01); C08K 5/36 (2013.01); C08K 5/521 (2013.01); C08L 27/16 (2013.01); C08L 47/00 (2013.01); C08L 83/08 (2013.01); C09D 11/101 (2013.01); C08L 2203/16 (2013.01); C08L 2203/20 (2013.01); C08L 2312/06 (2013.01)

(58) Field of Classification Search
CPC . C08J 5/18; C08J 3/24; C08J 2327/16; C08K 5/17; C08K 5/07; C08K 5/10; C08K 5/0025; C08K 5/06; C08K 5/36; C08K 5/521; C09D 127/16; C09D 127/01; C09D 11/101; C09D 11/106; C08F 214/24; C08F 214/20; C08L 83/08; C08L 47/00; C08L 51/0043; C08L 27/16; C08L 2203/20; C08L 2203/16; C08L 2312/00; H01L 51/0043; H01L 51/0052
USPC .................................................. 522/1; 520/1
See application file for complete search history.

(56) References Cited

U.S. PATENT DOCUMENTS 4,128,517 A 12/1978 Kydonieus
7,122,608 B1 10/2006 Brinati et al.
(Continued)

FOREIGN PATENT DOCUMENTS

CN 103387682 A 11/2013
CN 104246540 A 12/2014
(Continued)

OTHER PUBLICATIONS

Tan et al, Synthesis of fluoropolymer containing tunable unsaturation by a controlled dehydrochlorination of P(VDF-co-CTFE) and its curing for high performance rubber applications, J. Mater. Chem. 2012, 22, 18496-18504 (Year: 2012).*
(Continued)

Primary Examiner — Jessica Whiteley
(74) Attorney, Agent, or Firm — Buchanan Ingersoll & Rooney P.C.

(57) ABSTRACT

A process for preparing a crosslinked fluoropolymer film, including the successive steps of: (1) formulating an ink containing: (a) the product of the reaction of triethylamine with at least one fluorinated copolymer obtained by radical copolymerization of monomers including: (i) vinylidene fluoride (VDF), (ii) trifluoroethylene (TrFE), (iii) at least one chlorinated monomer of formula —CXCl=CX$_1$X$_2$ where X, X$_1$ and X$_2$ independently denote H, F or CF$_3$, wherein at most one of X, X$_1$ and X$_2$ denotes CF$_3$; (b) at least one crosslinking agent; (c) at least one photoinitiator; and (d) at least one organic solvent; (2) applying said ink in film form to a substrate; and (3) UV-irradiating said film. Also, the film capable of being obtained according to this process, and also to the uses thereof, in particular in the manufacture of (opto)electronic devices and more particularly in the manufacture of a gate dielectric layer in a field-effect transistor.

10 Claims, 2 Drawing Sheets

(51) Int. Cl.
| | |
|---|---|
| *C08K 5/06* | (2006.01) |
| *C08K 5/07* | (2006.01) |
| *C08K 5/10* | (2006.01) |
| *C08K 5/17* | (2006.01) |
| *C08K 5/36* | (2006.01) |
| *C08K 5/521* | (2006.01) |
| *C08L 27/16* | (2006.01) |
| *C08L 47/00* | (2006.01) |
| *C08L 83/08* | (2006.01) |
| *C09D 11/101* | (2014.01) |

(56) References Cited

U.S. PATENT DOCUMENTS

| | | | |
|---|---|---|---|
| 2012/0014859 A1 | 1/2012 | Honda et al. | |
| 2012/0116039 A1* | 5/2012 | Bauer | C08F 214/22 526/249 |
| 2012/0193587 A1 | 8/2012 | Sakuraba et al. | |
| 2014/0216549 A1* | 8/2014 | Satoh | H02S 40/00 136/259 |
| 2015/0116835 A1* | 4/2015 | Ogumi | G02B 5/0221 359/601 |
| 2016/0046746 A1* | 2/2016 | Ameduri | C08F 214/22 526/255 |
| 2017/0047607 A1 | 2/2017 | Schmidt et al. | |
| 2017/0141291 A1 | 5/2017 | Aliane et al. | |
| 2017/0192354 A1* | 7/2017 | Zhao | C09D 127/16 |

FOREIGN PATENT DOCUMENTS

| | | |
|---|---|---|
| CN | 106663736 A | 5/2017 |
| EP | 0460284 A2 | 12/1991 |
| GB | 888766 A | 2/1962 |
| JP | 2010254543 A | 11/2010 |
| WO | 2010116105 A1 | 10/2010 |
| WO | 2011043489 A1 | 4/2011 |
| WO | 2014162080 A1 | 10/2014 |
| WO | 2015158979 A1 | 10/2015 |
| WO | 2015200872 A1 | 12/2015 |

OTHER PUBLICATIONS

Tan et al, Significantly improving dielectric and energy storage properties via uniaxially stretching crosslinked P(VDF-co-TrFe films, Jun. 25, 2013, J. Mater. Chem. A., 2013, 1, 10353-10361 (Year: 2013).*
International Search Report (PCT/ISA/210) dated Jul. 17, 2018, by the European Patent Office as the International Searching Authority for International Application No. PCT/FR2018/051818.
Japanese Office Action (Notice of Reasons for Rejection) dated Dec. 17, 2019, issued in the corresponding Japanese Patent Application No. 2018-559827. (3 pages).
Tan, S. et al., "Significantly improving dielectric and energy storage properties via uniaxially stretching crosslinked P(VDF-co-TrFE) films", Journal of Materials Chemistry A: Materials for Energy and Sustainability, vol. 1, No. 35, pp. 10353-10361, Jan. 1, 2013, XP055429969.
Tan, S. et al., "Synthesis of fluoropolymer containing tunable unsaturation by a controlled dehydrochlorination of P(VDF-co-CTFE) and its curing for high performance rubber applications", Journal of Materials Chemistry, Royal Society of Chemistry, vol. 22, No. 35, pp. 18496-18504 , Sep. 21, 2012, XP002731229.
Written Opinion (PCT/ISA/237) dated Jul. 17, 2018, by the European Patent Office as the International Searching Authority for International Application No. PCT/FR2018/051818.
Office Action (The First Office Action) dated Sep. 1, 2021, by the China National Intellectual Property Administration in corresponding Chinese Patent Application No. 201880045663.1, English Translation only (8 pages).
Common knowledge: "Polymer Synthesis Technology", 1st edition, Jun Wei, paragraph 2, p. 12, East China University of Science and Technology Press, Feb. 28, 2011, 3 pages.

* cited by examiner

METHOD FOR PREPARING A CROSS-LINKED FLUORINATED POLYMER FILM

FIELD OF THE INVENTION

The present invention relates to a process for preparing a crosslinked fluoropolymer film. It also relates to the film capable of being obtained according to this process, and also to the uses thereof, in particular in the manufacture of (opto)electronic devices and more particularly as a gate dielectric layer in a field-effect transistor.

TECHNICAL BACKGROUND

Fluoropolymers based on vinylidene fluoride (VDF) represent a class of compounds with remarkable properties for a large number of applications. PVDF and copolymers comprising VDF and trifluoroethylene (TrFE) are particularly interesting owing to their ferroelectric, piezoelectric and pyroelectric properties. These materials, electroactive fluoropolymers, or EAFPs, have a spontaneous polarization at low temperature, which can be reversed by application of an external electric field. The variation of their polarization as a function of the field is not linear and, if the electric field is alternating, the polarization describes a hysteresis cycle characterized by the remanent polarization and the coercive field (applied electric field necessary for the cancellation of the polarization). Beyond a transition temperature, the ferroelectric materials exhibit a behavior similar to a linear dielectric material, separating the ferroelectric state from a paraelectric state.

Among ferroelectric materials, it is possible to distinguish, depending on the characteristics of their transition but also by their frequency behavior, between conventional ferroelectric materials and relaxor ferroelectric materials. Specifically, conventional ferroelectric materials exhibit a narrow maximum of their dielectric constant at the Curie temperature $T_C$ where the ferroelectric-paraelectric transition occurs. The value of $T_C$ is further independent of the frequency. On the contrary, relaxor ferroelectric materials have a curve of dielectric permittivity (also referred to as dielectric constant) as a function of temperature that has a diffuse transition peak extending over a relatively wide temperature range, $T_C'$, where the relaxor ferroelectic-paraelectric transition occurs. Moreover, the dielectric constant maximum is shifted to higher temperatures when the frequency increases.

It is known that the use of a third monomer bearing a bulky substituent, such as chlorofluoroethylene (CFE) or chlorotrifluoroethylene (CTFE) makes it possible to modify the crystallization of ferroelectric polymers based on VDF and TrFE, so as to give them properties of relaxor materials with significant electrostrictive effects and better dielectric permittivity.

However, these ferroelectric polymers and relaxor ferroelectric polymers must be crosslinked to improve their electronic and mechanical properties, in particular their dielectric constant, in order to incorporate them into certain devices such as transistors. Crosslinking also gives these polymers a solvent resistance, making it possible to use them in photolithography processes. It is in particular desirable for them to be able to be photocrosslinked, in particular to enable the production of patterns ("patterning") from a layer or film of the polymer, and in order to avoid the problems inherent to the films obtained by thermal crosslinking.

A process has already been suggested in application WO 2015/200872 for photocrosslinking fluoropolymers, such as a terpolymer (VDF-ter-TrFE-ter-CFE), comprising the formulation of an ink containing this copolymer, a non-nucleophilic base, such as a tertiary amine of polycyclic or heteroaromatic structure, and a crosslinking agent. This ink is deposited on a substrate to form a film which is then exposed to UV radiation, so that the base gives rise to a dehydrohalogenation of the copolymer. A double bond is thus formed in the structure of the copolymer, and hydrochloric acid is released. This double bond may then be crosslinked by the crosslinking agent. In this process, the steric hindrance generated by the amine makes it possible to prevent the reaction of the amine with the fluorine atoms present in the copolymer and to thus result in the concomitant formation of hydrogen fluoride.

It has become apparent to the Applicant that a particular base, having a low steric hindrance, namely triethylamine, could be substituted for the tertiary amines of WO 2015/200872 without substantially affecting the electronic, thermal and/or chemical properties of the crosslinked film obtained, or even improving at least some of these properties.

Triethylamine has already been used in reactions for dehydrochlorination of copolymers or terpolymers of poly (VDF-ter-TrFE-ter-CTFE) type (*J. Mater. Chem.*, 2013, 1, 10353-10361) and of poly(VDF-co-CTFE) type (*J. Mater. Chem.*, 2012, 22, 18496-18504). The copolymers described in the second publication do not however have relaxor ferroelectric properties owing to the absence of trifluoroethylene monomer. Moreover, in these two publications, the resulting materials are crosslinked using thermal peroxides. These peroxides, often used at high temperatures (above 100° C.), do not allow the production of patterns at room temperature. These processes are not therefore suitable for the manufacture of electronic devices.

SUMMARY OF THE INVENTION

One subject of the invention is a process for preparing crosslinked fluoropolymer films, comprising the successive steps of:

(1) formulating an ink containing, preferably consisting of: the product of the reaction of triethylamine with at least one fluorinated copolymer obtained by radical copolymerization of monomers comprising, and preferably consisting of: (i) vinylidene fluoride (VDF), (ii) trifluoroethylene (TrFE), (iii) at least one chlorinated monomer of formula —CXCl=CX$_1$X$_2$ where X, X$_1$ and X$_2$ independently denote H, F or CF$_3$, it being understood that at most one of X, X$_1$ and X$_2$ denotes CF$_3$; (b) at least one crosslinking agent; (c) at least one photoinitiator; and (d) at least one organic solvent;

(2) applying said ink in film form to a substrate; and (3) UV-irradiating said film.

Other subjects of the invention are a crosslinked fluoropolymer film capable of being obtained according to this process, and also the use of this film for the manufacture of (opto)electronic devices, including thin-film transistors, light transistors, field-effect transistors and capacitors; haptic devices; actuators; microelectromechanical systems (MEMS); sensors; steerable catheters; Braille keyboards; acoustic devices (loudspeakers or "tweeters"); electrocaloric devices; energy recovery devices, preferably in the manufacture of transistors.

It was observed that the process according to the invention made it possible to obtain an electroactive semicrystalline material having a high solvent resistance, a low coercive field, a high electrical permittivity and/or a high saturation polarization.

FIGURES

DESCRIPTION OF EMBODIMENTS OF THE INVENTION

Figure 1:
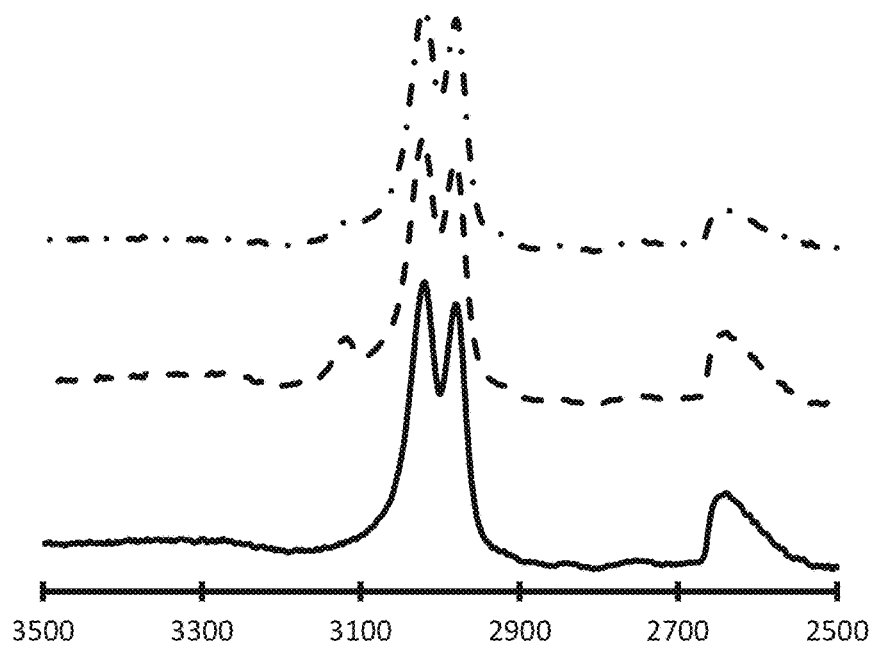
FIG. 1 represents the FTIR spectrum of the products P1 (solid line), P3 (broken line) and P2 (broken-dotted line), prepared according to Example 1, where the abscissa axis corresponds to the wavenumber in $cm^{-1}$ and the ordinate axis corresponds to the relative absorbance.

As indicated above, the present invention relates to a process for preparing a film from an ink containing an electroactive fluorinated copolymer.

The fluorinated copolymer used in this invention comprises a unit derived from vinylidene fluoride (VDF) and a unit derived from trifluoroethylene (TrFE). It further contains at least one chlorinated monomer of formula —CXCl═$CX_1X_2$ where X, $X_1$ and $X_2$ independently denote H, F or $CF_3$, it being understood that at most one of X, $X_1$ and $X_2$ denotes $CF_3$. Examples of such chlorinated monomers are in particular chlorofluoroethylene (CFE), chlorotrifluoroethylene (CTFE), 2-chloro-3,3,3-trifluoropropene, 1-chloro-3,3,3-trifluoropropene, preferably CTFE and CFE. This copolymer may further contain at least one other unit derived from a fluorinated monomer, which may in particular be chosen from: tetrafluoroethylene (TFE), hexafluoropropylene (HFP), 2-(trifluoromethyl)acrylic acid, trifluoropropene, tetrafluoropropene, hexafluoroisobutylene, (perfluorobutyl)ethylene, pentafluoropropene, perfluoroalkyl ethers such as PMVE, PEVE and PPVE, and mixtures thereof. It is clearly understood that all the geometric isomers of the aforementioned fluorinated compounds are included in the above terminologies, such as 3,3,3-trifluoropropene, 2,3,3,3-tetrafluoropropene (or 1234yf), 3-chloro-2,3,3-trifluoropropene (or 1233yf). Moreover, it is preferred that the copolymer according to the invention does not contain any unit derived from a non-fluorinated monomer. According to one embodiment of the invention, the fluorinated copolymer is a terpolymer containing only units derived from VDF, TrFE and the chlorinated monomer.

According to one embodiment, the proportion of units derived from TrFE is preferably from 5 to 95 mol %, relative to the sum of the units obtained from VDF and TrFE, and in particular: from 5 to 10 mol %; or from 10 to 15 mol %; or from 15 to 20 mol %; or from 20 to 25 mol %; or from 25 to 30 mol %; or from 30 to 35 mol %; or from 35 to 40 mol %; or from 40 to 45 mol %; or from 45 to 50 mol %; or from 50 to 55 mol %; or from 55 to 60 mol %; or from 60 to 65 mol %; or from 65 to 70 mol %; or from 70 to 75 mol %; or from 75 to 80 mol %; or from 80 to 85 mol %; or from 85 to 90 mol %; or from 90 to 95 mol %. A range from 15 to 55 mol % is particularly preferred.

The proportion of units derived from the chlorinated monomer (relative to all of the units) may vary, for example, from 1 to 20 mol %, in particular from 5 to 15 mol %.

For their part, the units derived from the additional monomer optionally present may represent from 0 to 20 mol % and preferably from 5 to 15 mol %, relative to all of the units.

The copolymers used according to the invention are advantageously random and linear.

The copolymers used according to the invention are prepared by radical polymerization according to a solution, suspension, emulsion or microemulsion polymerization process.

The copolymerization reaction is generally carried out in the presence of a radical initiator. This initiator may be, for example, a t-alkyl peroxyester such as tert-butyl peroxypivalate (or TBPPI), tert-amyl peroxypivalate, a peroxydicarbonate such as bis(4-tert-butylcyclohexyl) peroxydicarbonate, sodium, ammonium or potassium persulfate, benzoyl peroxide and its derivatives, a tert-alkyl hydroperoxide such as tert-butyl hydroxyperoxide, a t-alkyl peroxide such as tert-butyl peroxide or a t-alkyl peroxyalkane such as 2,5-bis(tert-butylperoxy)-2,5-dimethylhexane. Alternatively or in addition, an azo initiator or a redox system may be used as radical initiator.

According to a first embodiment, the copolymer used according to the invention is prepared by a radical solution polymerization process, such as that described in particular in patent application WO 2014/162080, comprising a step of copolymerizing a reaction mixture of fluorinated monomers and chlorinated monomer in the presence of a radical initiator in a solvent.

According to a particular embodiment:
  the proportion of TrFE in the reaction mixture is preferably from 5 to 95 mol %, relative to the sum of the VDF and TrFE monomers, and in particular: from 5 to 10 mol %; or from 10 to 15 mol %; or from 15 to 20 mol %; or from 20 to 25 mol %; or from 25 to 30 mol %; or from 30 to 35 mol %; or from 35 to 40 mol %; or from 40 to 45 mol %; or from 45 to 50 mol %; or from 50 to 55 mol %; or from 55 to 60 mol %; or from 60 to 65 mol %; or from 65 to 70 mol %; or from 70 to 75 mol %; or from 75 to 80 mol %; or from 80 to 85 mol %; or from 85 to 90 mol %; or from 90 to 95 mol %, a range of from 15 to 55 mol % being particularly preferred;
  the proportion of chlorinated monomer in the reaction mixture may vary, for example, from 1 to 20 mol %, in particular from 5 to 15 mol %; and
  the proportion of additional monomer optionally present in the reaction mixture may represent from 0 to 20 mol % and preferably from 5 to 15 mol %,
the above percentages being expressed relative to all of the monomers present in the reaction mixture, the sum of which is equal to 100%.

According to one embodiment, the reaction mixture consists essentially of, and preferably consists of, a mixture of vinylidene fluoride, trifluoroethylene, chlorinated monomer, radical initiator, and solvent. The term "consists essentially" is understood to mean that it contains at least 70 mol %, more preferentially at least 80 mol %, for example at least 90 mol %, or even at least 95 mol %, of these constituents.

The reaction is carried out in a solvent, which is for example chosen from an organic solvent such as 1,1,1,3,3-pentafluorobutane, 2,2,2-trifluoroethanol, hexafluoroisopropanol; 1,1,2-trifluorotrichloroethane; dimethylformamide; dimethylacetamide; dimethyl sulfoxide; ketones, in particular acetone, methyl ethyl ketone, methyl isobutyl ketone and cyclopentanone; furans, in particular tetrahydrofuran; esters, in particular methyl acetate, ethyl acetate, propyl acetate, butyl acetate and propylene glycol methyl ether acetate; carbonates, in particular dimethyl carbonate; phosphates, in particular triethyl phosphate; water and mixtures thereof.

According to one embodiment, the reaction mixture is heated up to a reaction initiation temperature of between 20° C. and 100° C. and preferably between 25° C. and 80° C. The initial pressure inside the autoclave varies according to the solvent, the reaction temperature and the amount of monomers. It is generally between 0 and 80 bar, for example between 20 and 40 bar. The choice of the optimum temperature depends on the initiator that is used. Generally, the reaction is carried out for a period of two to four times the half-life of the initiator used, for example from 6 hours to 25 h, at a temperature at which the half-life of the initiator is between 1 and 10 hours.

The molar mass of the copolymer obtained by solution polymerization is preferably from 5000 to 200 000 g/mol, more preferentially from 10 000 to 150 000 g/mol.

According to another embodiment, the copolymer used according to the invention is prepared by a radical suspension polymerization process, such as that described in particular in patent application WO 2010/116105, comprising a step of copolymerizing a reaction mixture of monomers in the presence of water, a radical initiator, optionally a dispersing agent and, optionally, a chain-transfer agent.

The suspension process makes it possible to avoid the use of toxic solvents and of fluorinated surfactants (of the bioaccumulative, toxic and persistent PFOA or PFOS type) during the synthesis and the purification of the copolymer.

In the suspension process, the monomers are charged to a stirred reactor containing deionized water, optionally a dispersing agent and, optionally, a chain-transfer agent. The reactor is then brought to the desired initiation temperature, this temperature being maintained during the polymerization at a value between 40° C. and 60° C. The initiator is then injected into the reactor in order to initiate the polymerization. The consumption of the monomers leads to a reduction in pressure which is generally maintained in the range of 80 to 110 bar by injection of deionized water or a mixture of monomers. The reactor is then cooled and degassed. The product is discharged and recovered in the form of a suspension. This suspension is filtered and the wet powder is washed and then dried.

According to yet another embodiment, the copolymer used according to the invention is prepared according to a radical emulsion polymerization process.

To do this, an aqueous dispersion of the initiator stabilized by the surfactant used to carry out the polymerization is advantageously prepared. It is preferred not to use perfluorinated surfactant. To carry out this dispersion, the water, the initiator and a small fraction of all of the surfactant are mixed in a disperser. It is this dispersion which is added at the beginning and then optionally during the polymerization. After charging the polymerization reactor with water, surfactant and optionally paraffin, the reactor is pressurized, after having removed the oxygen, by adding thereto vinylidene fluoride alone or as a mixture with the comonomers, and the resulting mixture is brought to the chosen temperature. Advantageously, the aqueous emulsion is polymerized at a temperature of from 50° C. to 130° C. Preferably, the polymerization is carried out at an absolute pressure of 40 to 120 bar. The initiation of the reaction is obtained by adding the initiator dispersion. During the polymerization, the VDF, alone or as a mixture with the comonomers, is optionally added in order to maintain the pressure or to obtain a controlled pressure variation. The initiator is optionally added in increments or continuously. A chain-transfer agent (CTA) can optionally be added at the beginning of or during the polymerization. In the latter case, it can be introduced in increments or continuously. After introduction of the planned amount of mixture of monomers, the reactor is degassed and cooled and the latex is emptied out.

The recovery of the polymer from the latex constitutes the finishing operation. This consists essentially in coagulating the latex then in drying the coagulate so as to obtain a dry powder. The finishing can also include a washing step. This washing can, for example, be carried out by introducing the latex, optionally diluted, into a coagulator in which it is subjected to a shear in the presence of air. Under the cumulative effect of these two actions, the latex is converted into an aerated cream with a density lower than that of water. This cream is optionally subjected to countercurrent washing with deionized water, for example according to the process described in U.S. Pat. No. 4,128,517 and EP 0 460 284. The drying can be carried out according to any industrial means known to a person skilled in the art. In particular, the coagulated latex or the cream may advantageously be dried in a spray dryer. Thus, on exiting the washing column, or immediately after the coagulation, the aerated cream is sent to a storage container before being directed, by pumping, into a spray dryer which converts it into a dry powder. This drying step in a spray dryer can also be applied to the initial, optionally diluted, latex, to the coagulated latex (for example coagulated by mechanical shearing with or without prior dilution) or else to the aerated cream.

Another emulsion polymerization process that can be used for preparing the copolymer used according to the invention is the one described in document U.S. Pat. No. 7,122,608.

The copolymer according to the invention is reacted with triethylamine and formulated in the form of a photocrosslinkable ink comprising at least one crosslinking agent, at least one photoinitiator and at least one organic solvent.

As indicated above, triethylamine makes it possible to dehydrochlorinate the copolymer, i.e. to remove one molecule of HCl from each CFCl—CH$_2$ unit with which it is capable of reacting. These units may originate for example from a CFE monomer or a VDF-CTFE dimer. Double bonds are thus created in the copolymer, which can then react with the crosslinking agent in order to crosslink it. Advantageously, the process according to the invention generates substantially no hydrofluoric acid (HF).

The proportion of triethylamine is preferably adjusted so as to retain —CFCl—CH$_2$— units within the copolymer at the end of the process.

Triethylamine may thus represent from 0.1 to 2 molar equivalents relative to the number of moles of chlorinated monomer, preferably from 0.2 to 1.5 molar equivalents.

In a first embodiment of the invention, the reaction between the copolymer described above and triethylamine is carried out in situ within the ink in which these two compounds are formulated. The ink according to the invention thus contains this copolymer and triethylamine, in addition to the crosslinking agent, the photoinitiator and the organic solvent. In a second embodiment of the invention, the copolymer is reacted with triethylamine before being mixed with the other constituents of the ink. The ink according to the invention is thus obtained by mixing the product of this reaction with the crosslinking agent, the photoinitiator and the organic solvent. In other words, the process according to the invention comprises a preliminary step that consists in reacting the copolymer described above with triethylamine, generally in an organic solvent which may in particular be chosen from those listed below as constituents of the ink. This reaction may for example be carried out for a period of 1 to 10 hours, in particular of 2 to 6 hours, at a temperature ranging for example from 20° C. to 80° C. and preferably from 30° C. to 60° C. The product of this reaction is generally purified and dried before being used in the process according to the invention.

As indicated above, the ink used according to the invention also comprises at least one crosslinking agent and at least one photoinitiator.

The crosslinking agent may be any compound capable of reacting with double bonds, in particular a small molecule or a polymer or prepolymer bearing either one or more thiol groups capable of reacting with the double bonds by thiol-ene click chemistry, or one or more amine groups capable of reacting with the double bonds by hydroamination, or one or more maleimide groups capable of reacting with the double bonds by conjugation. As a variant, the crosslinking agent may be a small molecule or a polymer or prepolymer bearing one or more vinyl groups. It is clearly understood that the above examples are not limiting and that it is furthermore possible to use a crosslinking agent bearing several of the aforementioned reactive groups or several crosslinking agents bearing different reactive groups. Examples of such crosslinking agents include in particular poly(3-mercaptopropyl)methylsiloxane, maleimide siloxane, pentaerythritol tetrakis(3-mercaptopropionate), trimethylethylenediamine, 1,2-diamino-4,5-difluorobenzene and butane-1,4-trans-cinnamate, without this list being exhaustive.

The preferred crosslinking agents for use in the present invention are monomers or oligomers bearing at least two (meth)acrylic functions that are reactive in radical polymerization, which may optionally further comprise at least one other function chosen from hydroxyl, ester, ether, urethane, epoxy, cyanurate or isocyanurate functions. Mention may thus be made, for example, of the following compounds: 1,3-butylene glycol di(meth)acrylate, butanediol di(meth)acrylate, 1,6-hexanediol di(meth)acrylate, alkoxylated hexanediol di(meth)acrylate, alkoxylated neopentyl glycol di(meth)acrylate, dodecyl di(meth)acrylate, cyclohexane dimethanol di(meth)acrylate, diethylene glycol di(meth)acrylate, dipropylene glycol di(meth)acrylate, linear alkane di(meth)acrylates, ethoxylated bisphenol A di(meth)acrylate, ethylene glycol di(meth)acrylate, neopentyl glycol di(meth)acrylate, tricyclodecane dimethanol diacrylate, triethylene glycol di(meth)acrylate, tetraethylene glycol di(meth)acrylate, tripropylene glycol di(meth)acrylate, ditrimethylolpropane tetra(meth)acrylate, ethoxylated pentaerythritol tetra(meth)acrylate, dipentaerythritol penta(meth)acrylate, penta(meth)acrylate ester, pentaerythritol tetra(meth)acrylate, ethoxylated trimethylolpropane tri(meth)acrylate, alkoxylated trimethylolpropane tri(meth)acrylate, trimethylolpropane tri(meth)acrylate, pentaerythritol tri(meth)acrylate, propoxylated trimethylolpropane tri(meth)acrylate, trimethylolpropane trimethacrylate, dodecanediol di(meth)acrylate, dodecane di(meth)acrylate, dipentaerythritol penta/hexa(meth)acrylate, pentaerythritol tetra(meth)acrylate, ditrimethylolpropane tetra(meth)acrylate, propoxylated glyceryl tri(meth)acrylate, propoxylated glyceryl tri(meth)acrylate, tris(2-hydroxyethyl) isocyanurate tri(meth)acrylate, polyester (meth)acrylates, polyether (meth)acrylates, polyethylene glycol (meth)acrylates, polypropylene glycol (meth)acrylates, polyurethane (meth)acrylates, epoxy (meth)acrylates, and combinations thereof.

The crosslinking agent may represent from 1 to 20 mol % and preferably from 3 to 10 mol %, relative to the number of moles of copolymer.

Examples of photoinitiators that can be used in the ink used according to the invention include: 2-hydroxy-2-methyl-1-phenylpropan-1-one, 2,4,6-trimethylbenzoyldiphenyl-phosphine oxide, 2,4,6-trimethylbenzoylphenyl phosphinate, 1-hydroxycyclohexyl phenyl ketone, bis(2,6-dimethoxybenzoyl)-2,4,4-trimethylpentylphosphine oxide, 1-[4-(2-hydroxyethoxy)phenyl]-2-hydroxy-2-methyl-1-propan-1-one, 2,2-dimethoxy-1,2-diphenylethan-1-one, 2-methyl-1-[4-(methylthio)phenyl]-2-morpholinopropan-1-one, 2,4-diethylthioxanthone, derivatives thereof, and mixtures thereof.

The abovementioned constituents are carried in a polar organic solvent which may be chosen, in a nonlimiting manner, from esters such as ethyl acetate, propyl acetate, butyl acetate, isobutyl propionate, propylene glycol monomethyl ether, methyl lactate, ethyl lactate and gamma-butyrolactone; alkyl phosphates such as triethyl phosphate; alkyl carbonates such as dimethyl carbonate; ketones such as acetone, acetylacetone, methyl isobutyl ketone, 2-butanone, 2-pentanone, 2-heptanone, 3-heptanone, cyclopentanone and cyclohexanone; amides such as dimethylformamide (DMF) or dimethylacetamide (DMAc); sulfur-containing solvents such as dimethyl sulfoxide (DMSO); halogenated solvents such as chloroform, and halogenated alkanes; and mixtures thereof. It is preferred in this invention to use 2-butanone, cyclohexanone, dimethyl sulfoxide, propylene glycol monomethyl ether, triethyl phosphate, dimethylacetamide, and mixtures thereof.

Once the ink is obtained from the constituents described above, it is applied in the form of a film on a substrate which may be of any nature and in particular may consist of one or more glass or metal or organic (in particular polymeric) layers. The copolymer used according to the invention specifically has sufficient mechanical properties to enable it to be shaped into a film. This film shaping can be carried out for example: by pouring of the ink; by spin coating of the ink; by immersion in the ink; or by printing the ink, in particular by inkjet or screen printing. The films thus obtained, after a drying step and then optionally an annealing step (in particular at a temperature of from 70° C. to 140° C.), have good mechanical properties and can, if necessary, be stretched. Their thickness may for example be between 10 nm and 100 μm, preferably between 50 nm and 50 μm and more preferentially between 100 nm and 10 μm.

Before this film-forming step, it is possible to add various additives to the crosslinkable ink, such as reinforcing fillers, conductive fillers such as carbon nanotubes, conductive salts, piezoelectric particles such as piezoelectric, ferroelectric or pyroelectric nanoparticles, such as PZT or $BaTiO_3$ ceramics, plasticizers, adhesion promoters and mixtures thereof.

It is also possible to add to the ink, after reaction of triethylamine with the copolymer according to the invention, one or more other copolymers according to the invention, which are identical to or different from the one reacted with triethylamine. In this case, it will generally be ensured that this additional copolymer represents at most 60% by weight relative to the total weight of (modified and unmodified) copolymers according to the invention present in the ink.

The film obtained is then subjected to UV irradiation, generally at a temperature of from 15° C. to 40° C., for example from 20° C. to 30° C., to complete the crosslinking of the copolymer. For this purpose, it is possible to use any technique known to a person skilled in the art and in particular irradiation with a mercury-vapor lamp. After this UV irradiation step, the film may optionally be subjected to a thermal post-treatment step at a temperature ranging for example from 70° C. to 140° C.

The crosslinked copolymers obtained according to the invention have a semicrystalline character.

Their melting temperature is generally between 100° C. and 160° C., more particularly between 105° C. and 155° C., for example between 110° C. and 130° C. The melting temperature is measured by differential scanning calorimetry (DSC) on a 5 to 20 mg sample of polymer. This technique consists in measuring the differences in the heat exchanges between the sample to be analyzed and a reference. It makes it possible to determine phase transitions, including especially the melting temperature, and the enthalpies corresponding to these phenomena. For the copolymers of the invention, the temperature range scanned is from −20° C. to 200° C., at a rate of 10° C. per minute. At least 2 cycles (2 heating operations and 2 cooling operations) are carried out. The melting temperature is by convention the value at the maximum of the melting peak.

These copolymers furthermore satisfy at least one criterion which qualifies them as electroactive polymers, in particular they have a Curie temperature below their melting point, for example between 20° C. and 145° C., and a dielectric constant maximum of greater than 30.

These copolymers advantageously have a coercive field of less than 60 MV/m, an electrical permittivity of greater than 10, or greater than 20 or even greater than or equal to 30, at 25° C. and 1 kHz and/or a saturation polarization of greater than 30 $mC/m^2$, for example greater than 40 $mC/m^2$, or greater than 50 $mC/m^2$ or even greater than 60 $mC/m^2$.

Moreover, owing to their crosslinking, these copolymers additionally have a resistance to solvents such as those listed above, resulting in a loss of less than 20% of the mass of the film obtained according to the invention, after immersion in these solvents for five minutes at room temperature. It is thus possible to use this film in a photolithography process, in which the UV irradiation step described above is carried out in the presence of a mask, so as to crosslink certain parts of the film only, after which the non-crosslinked areas can be selectively removed with the aid of a solvent in the developing step.

The films obtained according to the invention are useful for the manufacture of (opto)electronic devices, including thin-film transistors, light transistors, field-effect transistors and capacitors; haptic devices; actuators; microelectromechanical systems (MEMS); sensors; steerable catheters; Braille keyboards; acoustic devices (loudspeakers or "tweeters"); electrocaloric devices; energy recovery devices, for example. It is preferred to use these films in transistors. In the field of printed organic electronics, the film according to the invention according to the invention can in particular be used for the manufacture of the gate dielectric layer of a field-effect transistor.

Owing to the aforementioned properties of the crosslinked copolymer forming the films according to the invention, these films may have advantageous characteristics in the above applications and in particular low leakage current densities, high breakdown voltages, high capacitance values, low operating voltages (typically less than 40 V, or even less than 30 V or less than 20 V) and/or a low hysteresis.

EXAMPLES

The examples below are given purely by way of illustration and are not intended to limit the scope of this invention which is defined by the appended claims.

A) Preparation of Fluorinated Copolymers

Preparative Example 1: Synthesis of a P(VDF-TrFE-CTFE) Terpolymer (P1)

The P(VDF-TrFE-CTFE) terpolymer is prepared by suspension polymerization in water. Introduced into a 3 l reactor, deaerated and under vacuum, at room temperature, are 2.28 kg of demineralized water, 208 g of TrFE, 302 g of VDF and then a stabilizer of hydroxypropylmethyl cellulose type. The reactor is heated to 48° C. and then a radical initiator of peroxydicarbonate type in solution in a transfer agent is added. The pressure in the reactor is between 80 and 100 bar. This pressure is kept constant during the polymerization by injection of a mixture of VDF/TrFE/CTFE having a 57/31/12 molar composition. After injecting 612 g of the secondary mixture, the injection is stopped and the reactor cooled to room temperature. The suspension is then washed with demineralized water for 24 h at 50° C. and then dried for 24 h at 60° C. under nitrogen flushing.

The final molar composition of the terpolymer determined by $^1H$ and $^{19}F$ NMR spectroscopy of the liquid is 62/30/8 with an MFI at 203° C. under 10 kg of 1.90 and a melting temperature determined by DSC during the second heating operation of 122.6° C.

Preparative Example 2: Preparation of a TEA-Modified Terpolymer (P2)

In a 250 ml single-necked round-bottomed flask surmounted by a water-cooled condenser, 5.02 g of terpolymer P1 containing 8 mol % of CTFE and 2.18 g of triethylamine (TEA) are mixed in 100 g of dimethyl sulfoxide (DMSO). The reaction medium is heated for 4 h at 50° C. with magnetic stirring.

The product is purified by precipitation from water, then reprecipitation from a methanol/water 50/50 mixture by weight. The modified P(VDF-TrFE-CTFE) terpolymer powder is then washed with methanol and then dried under vacuum at 50° C. for 8 h.

The yield of the reaction is 90% and the final product is characterized by infrared spectroscopy and differential scanning calorimetry.

Preparative Example 3: Preparation of a Comparative Terpolymer Modified by NN-DMBA (P3)

In a 250 ml single-necked round-bottomed flask surmounted by a water-cooled condenser, 5.03 g of terpolymer P1 containing 8 mol % of CTFE and 2.94 g of N,N-dimethylbenzylamine (NN-DMBA) are mixed in 100 g of dimethyl sulfoxide (DMSO). The reaction medium is heated for 4 h at 50° C. with magnetic stirring.

The product is purified by precipitation from water, then reprecipitation from a methanol/water 50/50 mixture by weight. The modified P(VDF-TrFE-CTFE) terpolymer powder is then washed with methanol and then dried under vacuum at 50° C. for 8 h.

The yield of the reaction is 89% and the final product is characterized by infrared spectroscopy.

B) Characterization of the Terpolymers

As shown in FIG. 1, which represents the FTIR spectrum of the products P1 to P3, the valence vibration bands characteristic of the C—H bonds of a —CH=CF— double bond are observed at 3120 cm$^{-1}$. This signal is more intense for the terpolymer modified with TEA (P2). With identical reaction conditions, TEA therefore enables a better chemical modification than NN-DMBA (P3).

Figure 2:
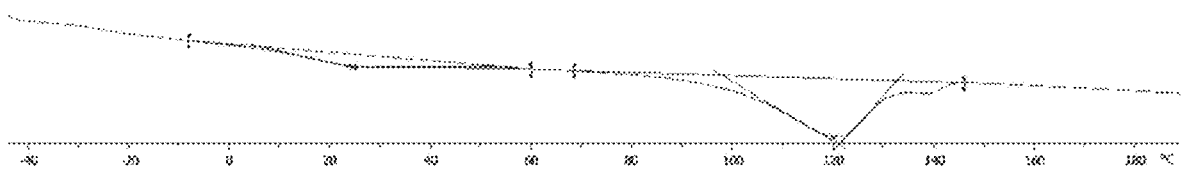
FIG. 2 represents the thermogram of the differential scanning calorimetry analysis during the second temperature rise between −50 and 200° C. of the product P2 prepared according to Example 1, where the abscissa axis corresponds to the temperature in ° C. and the melting temperature is measured at the top of the second endothermic peak at 120° C.

Moreover, as shown in FIG. 2, the modification of the terpolymer P1 by TEA (P2) does not significantly modify the semicrystalline structure of the material. The presence of a first endothermic peak at 25° C. is characteristic of the relaxor ferroelectric behavior of the TEA-modified terpolymer.

C) Preparation of Inks Containing Terpolymers

Example 1: Formulation of an Ink Containing a Terpolymer and TEA (E1)

In a 250 ml single-necked round-bottomed flask surmounted by a water-cooled condenser, 5.0 g of terpolymer P1 containing 8 mol % of CTFE, 50 mg of 6-trimethylbenzoylphenyl phosphinate (TPO-L), 25 mg of 2,4-diethylthioxanthone (DETX) and 2.0 g of triethylamine (TEA) are mixed in 100.0 g of butan-2-one (MEK). The solution is heated for 4 h at 80° C. with magnetic stirring.

The solution is left standing without stirring to cool to room temperature for at least 4 h and then filtered on a polypropylene filter having a porosity of 1 µm.

Example 2: Formulation of an Ink Containing a Terpolymer Previously Modified by TEA (S1 to S4)

In a 50 ml brown flask, 1.50 g of modified terpolymer P2 is dissolved in 20.0 g of propylene glycol methyl ether acetate (PGMEA). The solution is stirred with a magnetic bar at room temperature for 4 h.

In a second brown flask, 0.504 g of 6-trimethylbenzoylphenyl phosphinate (TPO-L) and 0.252 g of 2,4-diethylthioxanthone (DETX) are dissolved in 10.0 g of PGMEA. The solution is stirred with a magnetic bar at room temperature for 4 h.

In a 4 ml hemolysis tube, 42 mg of a co-crosslinking agent (polyacrylate or polythiol compound), 100 mg of photoinitiator solution and 3.0 g of the modified terpolymer solution are mixed by manual agitation.

Crosslinking Agents Used:
S1 None
S2 SR499 (ethoxylated trimethylolpropane triacrylate).
S3 SR351 (trimethylolpropane triacrylate).
S4 Polythiol (trimethylolpropane tris(3-mercaptopropionate)).

Example 3: Formulation of a Solution with a Co-Agent in a Single Step (S5)

In a 50 ml brown flask, 1.50 g of terpolymer P1, 0.65 g of TEA and 100 mg of photoinitiator solution are mixed in 20.0 g of propylene glycol methyl ether acetate (PGMEA). The solution is stirred with a magnetic bar at 50° C. for 4 h and then 0.30 g of the co-crosslinking agent SR499 (ethoxylated ethoxylated trimethylolpropane triacrylate) is added.

D) Evaluation of the Properties of the Fluoropolymers and Inks

1) Electroactivity

The electroactivity of the terpolymers P1 and P2 prepared in Example A is evaluated by polarization of a 20 µm film, providing access to the values of coercive field ($E_C$), remanent polarization (Pr) and saturation polarization ($P_{sat}$). An alternating electric field of increasing amplitude with a frequency of 50 mHz is applied via electrodes to a 1 mm$^2$ surface area of the film. The current passing through the sample is measured as a function of the electric field applied, via a precision ammeter.

Figure 3:
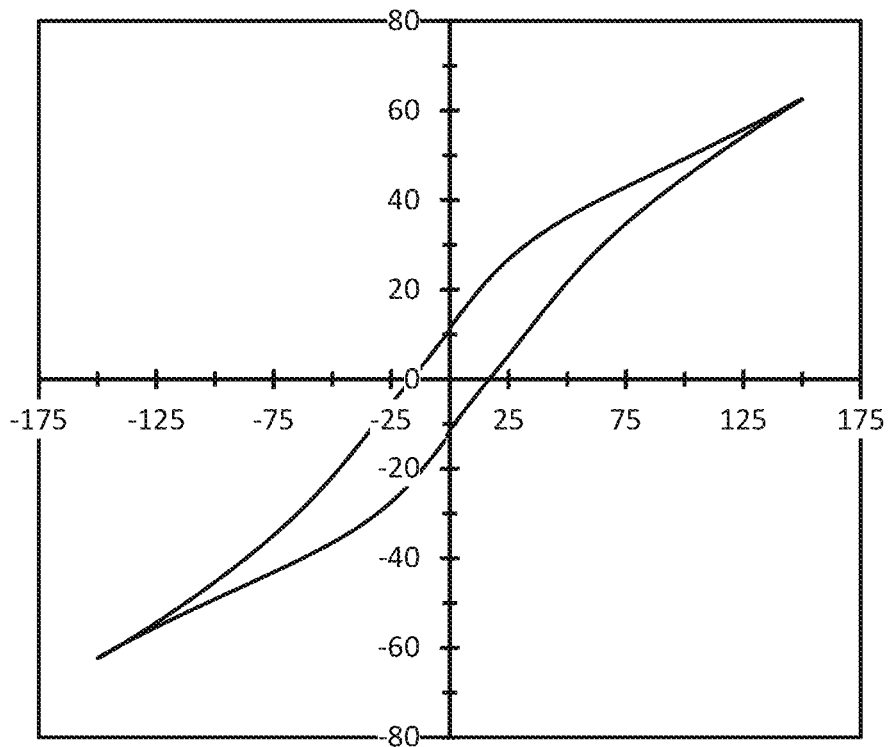
FIG. 3 illustrates the polarization curve of the product P1 prepared according to Example 1, where the abscissa axis corresponds to the electric field in $MV.m^{-1}$ and the ordinate axis corresponds to the displacement in $mC.m^{-2}$.
Figure 4:
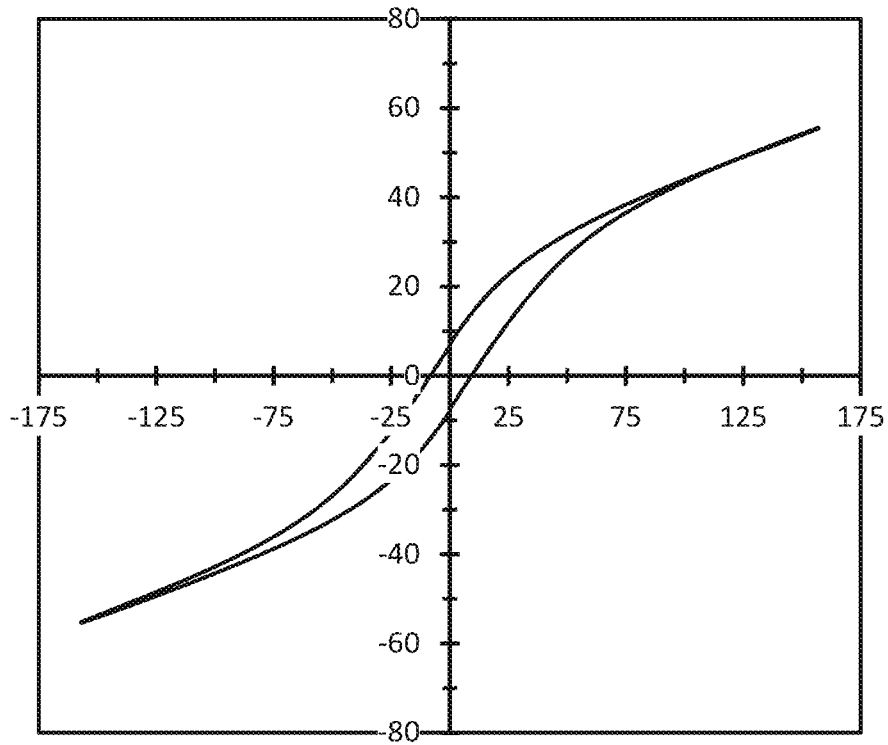
FIG. 4 represents the polarization curve of the product P2 prepared according to Example 1, where the abscissa axis corresponds to the electric field in $MV.m^{-1}$ and the ordinate axis corresponds to the displacement in $mC.m^{-2}$.

The results of this measurement are illustrated in FIGS. 3 and 4.

As can be seen from these figures, a reduction in the coercive field after chemical modification (from 17 to 8 MV/m) is observed, indicating a better relaxor ferroelectric behavior of the terpolymer P2 with respect to P1. The saturation polarization is still much higher than 30 mC.m$^{-2}$ with a $P_{sat}$=62.4 and 55.3 mC.m$^{-2}$, for P2 and P1, respectively.

2) Permittivity

The permittivity of the copolymers P1 to P3 was furthermore measured, which is reported in table 1 below:

TABLE 1

| Example | Relative Permittivity at 25° C. and 1 kHz |
| --- | --- |
| P1 | 30 |
| P2 | 33 |
| P3 | 30 |

As shown in this table, the permittivity of the terpolymer P1 is 30, thus much higher than that of the P(VDF-TrFE) copolymers which is generally around 10, due to the presence of CTFE. It might be thought that a chemical reaction that removes chlorine from CTFE might reduce the permittivity of the final product. It is observed here, on the contrary, that the terpolymer modified by TEA (P2) has a slightly higher permittivity than the initial terpolymer (P1) despite the dehydrochlorination reaction. This is not the case with the terpolymer modified by NN-DMBA (P3).

3) Solvent Resistance

The solvent resistance of the unmodified terpolymer P1 was evaluated in comparison with:
  the terpolymer formulated in the presence of TEA (E1), in the absence or in the presence of crosslinking agent (E1 and S5), and
  the same terpolymer modified by TEA and formulated in the absence or in the presence of various crosslinking agents (S1, S2, S3 and S4).

To do this, films on glass plates are made from the formulations E1, S1, S2, S3, S4, S5 prepared in examples C1 to C3, by spin coating (10 sec at 500 rpm with an Acc=500 rpm then 30 sec at 1000 rpm with Acc=500 rpm).

The deposit is dried on a hot plate at 100° C. for 1 minute and then irradiated with an LED UV lamp at 405 nm for 15 seconds. After irradiation, the film undergoes a thermal post-treatment step at 100° C. for 5 minutes.

The crosslinking of the films is evaluated by a test of resistance to PGMEA.

The results of this test are presented in Table 2 below where 0 corresponds to no solvent resistance (100% loss of mass) and 5 corresponds to less than 20% loss of mass.

TABLE 2

| Product | Solvent resistance |
| --- | --- |
| P1 | 0 |
| E1 | 1 |
| S1 | 1 |
| S2 | 5 |
| S3 | 5 |
| S4 | 4 |
| S5 | 5 |

As these results demonstrate, the solvent resistance of the unmodified terpolymer P1 is zero, and is slightly improved after TEA modification via two different processes (E1 and S1). The addition of co-crosslinking agents makes it possible to provide better resistance to PGMEA (S2 to S5).

The invention claimed is:

1. A process for preparing a crosslinked fluoropolymer film, comprising the successive steps of:
   (1) formulating an ink comprising:
      (a) a product of a partial reaction of triethylamine with at least one fluorinated copolymer, the fluorinated copolymer being a result of a radical copolymerization of monomers comprising:
         (i) vinylidene fluoride (VDF),
         (ii) trifluoroethylene (TrFE), and
         (iii) at least one chlorinated monomer of formula $-CXCl=CX_1X_2$ where X, $X_1$ and $X_2$ independently denote H, F or $CF_3$, wherein at most one of X, $X_1$ and $X_2$ denotes $CF_3$,
      wherein the partial reaction with triethylamine retains some $-CXCl-CH_2$ units in the fluorinated copolymer at the end of the partial reaction;
      (b) at least one crosslinking agent;
      (c) at least one photoinitiator; and
      (d) at least one organic solvent;
   (2) applying said ink in film form to a substrate; and
   (3) UV-irradiating said film.

2. The process as claimed in claim 1, wherein the chlorinated monomer is chlorotrifluoroethylene (CTFE) or chlorofluoroethylene (CFE).

3. The process as claimed in claim 1, wherein the proportion of units derived from TrFE ranges from 5 to 95 mol %, relative to the sum of the units derived from VDF and TrFE.

4. The process as claimed in claim 1, wherein the proportion of units derived from the chlorinated monomer varies from 1 to 20 mol %, relative to all of the units.

5. The process as claimed in claim 1, wherein the at least one fluorinated copolymer optionally contains an additional monomer, the units derived from the optional additional monomer represent from 0 to 20 mol %, relative to all of the units of the fluorinated copolymer.

6. The process as claimed in claim 1, wherein the crosslinking agent is chosen from monomers or oligomers bearing at least two (meth)acrylic functions that are reactive in radical polymerization, which may optionally further comprise at least one other function chosen from hydroxyl, ester, ether, urethane, epoxy, cyanurate or isocyanurate functions.

7. The process as claimed in claim 1, wherein the organic solvent is chosen from: esters; alkyl phosphates; alkyl carbonates; ketones; sulfur-containing solvents; halogenated solvents; and mixtures thereof.

8. A crosslinked fluoropolymer film capable of being obtained according to the process as claimed in claim 1.

9. A device comprising the film as claimed in claim 8, wherein the device is selected from (opto)electronic devices; haptic devices; actuators; microelectromechanical systems (MEMS); sensors; steerable catheters; Braille keyboards; acoustic devices; electrocaloric devices; and energy recovery devices.

10. A gate dielectric layer in a field-effect transistor comprising the film as claimed in claim 8.

* * * * *